(12) United States Patent
Chen et al.

(10) Patent No.: US 6,675,341 B1
(45) Date of Patent: Jan. 6, 2004

(54) EXTENDED ERROR CORRECTION FOR SEC-DED CODES WITH PACKAGE ERROR DETECTION ABILITY

(75) Inventors: Chin-Long Chen, Fishkill, NY (US); Douglas C. Bossen, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/442,435

(22) Filed: Nov. 17, 1999

(51) Int. Cl.[7] .............................................. H03M 13/00
(52) U.S. Cl. ...................................................... 714/753
(58) Field of Search ........................ 714/753, 754–772, 714/752, 746, 747–52, 799, 54, 57, 6, 785, 773

(56) References Cited

U.S. PATENT DOCUMENTS

| | | | |
|---|---|---|---|
| 3,893,071 A | * | 7/1975 | Bossen et al. ............... 714/765 |
| 4,493,081 A | * | 1/1985 | Schmidt ....................... 714/54 |
| 4,661,955 A | | 4/1987 | Arlington et al. .............. 714/6 |
| 4,961,193 A | * | 10/1990 | Debord et al. ............... 714/753 |
| 5,392,294 A | * | 2/1995 | Bosch et al. ................. 714/719 |
| 5,418,796 A | * | 5/1995 | Price et al. .................. 714/753 |
| 5,535,226 A | * | 7/1996 | Drake et al. ................. 714/773 |
| 5,956,351 A | * | 9/1999 | Bossen et al. ............... 714/757 |

OTHER PUBLICATIONS

NN8906263: (Family of Three Burst–Correcting Array Codes; IBM Tech. Disclosure Bulletin, vol. #32, Issue #1, pp.: 263–265; Jun. 1, 1989).*
NA9002125: ( Extended Error Correction Scheme for a Reed–Solomon Package Error Correction Code; IBM Tech. Disclosure Bulletin, vol. #32, Issue #9A, pp.: 125–130, Feb. 1, 1990).*
NN81055441: ( Error Detection for all Errors in a 9 Bit Memory Chip; IBM Tech. Disclosure Bulletin, vol. #23, Issue #12, p.: 5441, May 1, 1981).*

* cited by examiner

*Primary Examiner*—Albert Decady
*Assistant Examiner*—Guy Lamarre
(74) *Attorney, Agent, or Firm*—Lawrence D. Cutter; Cantor Colburn LLP

(57) ABSTRACT

An apparatus and method is provided for correcting data words resulting from a package fail within a memory array in which coded data is divided into a plurality of multi-bit packages of b bits each. The coded data comprises n-bit words with r error correcting code bits and n-r data bits. The invention is capable of correcting one package which has suffered at least one hard failure. The invention correcting exploits single error correcting (SEC)-and double error detecting (DED) codes, requiring no additional check bits, which give a syndrome when the data word has suffered an error coming from at least one error in a package.

10 Claims, 5 Drawing Sheets

PARITY CHECK MATRIX OF A (72,64) CODE

PACKAGE ERROR CORRECTION TABLE

| SYNDROME | PACKAGE POSITION | ERROR PATTERN | SYNDROME | PACKAGE POSITION | ERROR PATTERN | SYNDROME | PACKAGE POSITION | ERROR PATTERN |
|---|---|---|---|---|---|---|---|---|
| 11101100 | 1 | 0001 | 01111100 | 4 | 0001 | 11100110 | 7 | 0001 |
| 10001100 | 1 | 0010 | 00011100 | 4 | 0010 | 00100110 | 7 | 0010 |
| 01100000 | 1 | 0011 | 01100000 | 4 | 0011 | 11000000 | 7 | 0011 |
| 11001110 | 1 | 0100 | 11000111 | 4 | 0100 | 01101110 | 7 | 0100 |
| 00100010 | 1 | 0101 | 10111011 | 4 | 0101 | 10001000 | 7 | 0101 |
| 01000010 | 1 | 0110 | 11011011 | 4 | 0110 | 01001000 | 7 | 0110 |
| 10101110 | 1 | 0111 | 10100111 | 4 | 0111 | 10101110 | 7 | 0111 |
| 11001000 | 1 | 1000 | 11000001 | 4 | 1000 | 01100010 | 7 | 1000 |
| 00100100 | 1 | 1001 | 10111101 | 4 | 1001 | 10000100 | 7 | 1001 |
| 01000100 | 1 | 1010 | 11011101 | 4 | 1010 | 01000100 | 7 | 1010 |
| 10101000 | 1 | 1011 | 10100001 | 4 | 1011 | 10100010 | 7 | 1011 |
| 00000110 | 1 | 1100 | 00000110 | 4 | 1100 | 00001100 | 7 | 1100 |
| 11101010 | 1 | 1101 | 01111010 | 4 | 1101 | 11101010 | 7 | 1101 |
| 10001010 | 1 | 1110 | 00011010 | 4 | 1110 | 00101010 | 7 | 1110 |
| 01100110 | 1 | 1111 | 01100110 | 4 | 1111 | 11001100 | 7 | 1111 |
| 11011100 | 2 | 0001 | 10110110 | 5 | 0001 | 11010110 | 8 | 0001 |
| 01001100 | 2 | 0010 | 10000110 | 5 | 0010 | 00010110 | 8 | 0010 |
| 10010000 | 2 | 0011 | 00110000 | 5 | 0011 | 11000000 | 8 | 0011 |
| 11001101 | 2 | 0100 | 01101011 | 5 | 0100 | 01101101 | 8 | 0100 |
| 00010001 | 2 | 0101 | 11011101 | 5 | 0101 | 10111011 | 8 | 0101 |
| 10000001 | 2 | 0110 | 11101101 | 5 | 0110 | 01111011 | 8 | 0110 |
| 01011101 | 2 | 0111 | 01011011 | 5 | 0111 | 10101101 | 8 | 0111 |
| 11000100 | 2 | 1000 | 01101000 | 5 | 1000 | 01100001 | 8 | 1000 |
| 00011000 | 2 | 1001 | 11011110 | 5 | 1001 | 10110111 | 8 | 1001 |
| 10001000 | 2 | 1010 | 11101110 | 5 | 1010 | 01110111 | 8 | 1010 |
| 01010100 | 2 | 1011 | 01011000 | 5 | 1011 | 10100001 | 8 | 1011 |
| 00001001 | 2 | 1100 | 00000011 | 5 | 1100 | 00001100 | 8 | 1100 |
| 11010101 | 2 | 1101 | 10110101 | 5 | 1101 | 11011010 | 8 | 1101 |
| 01000101 | 2 | 1110 | 10000101 | 5 | 1110 | 00011010 | 8 | 1110 |
| 10011001 | 2 | 1111 | 00110011 | 5 | 1111 | 11001100 | 8 | 1111 |
| 10111100 | 3 | 0001 | 01110110 | 6 | 0001 | 11100011 | 9 | 0001 |
| 00101100 | 3 | 0010 | 01000110 | 6 | 0010 | 10000011 | 9 | 0010 |
| 10010000 | 3 | 0011 | 00110000 | 6 | 0011 | 01100000 | 9 | 0011 |
| 11001011 | 3 | 0100 | 01100111 | 6 | 0100 | 00111110 | 9 | 0100 |
| 01110111 | 3 | 0101 | 00010001 | 6 | 0101 | 11011101 | 9 | 0101 |
| 11100111 | 3 | 0110 | 00100001 | 6 | 0110 | 10111101 | 9 | 0110 |
| 01011011 | 3 | 0111 | 01010111 | 6 | 0111 | 01011110 | 9 | 0111 |
| 11000010 | 3 | 1000 | 01100100 | 6 | 1000 | 00111000 | 9 | 1000 |
| 01111110 | 3 | 1001 | 00010010 | 6 | 1001 | 11011011 | 9 | 1001 |
| 11101110 | 3 | 1010 | 00100010 | 6 | 1010 | 10111011 | 9 | 1010 |
| 01010010 | 3 | 1011 | 01010100 | 6 | 1011 | 01011000 | 9 | 1011 |
| 00001001 | 3 | 1100 | 00000011 | 6 | 1100 | 00000110 | 9 | 1100 |
| 10110101 | 3 | 1101 | 01110101 | 6 | 1101 | 11100101 | 9 | 1101 |
| 00100101 | 3 | 1110 | 01000101 | 6 | 1110 | 10000101 | 9 | 1110 |
| 10011001 | 3 | 1111 | 00110011 | 6 | 1111 | 01100110 | 9 | 1111 |

FIG. 4a

PACKAGE ERROR CORRECTION TABLE

| SYNDROME | PACKAGE POSITION | ERROR PATTERN | SYNDROME | PACKAGE POSITION | ERROR PATTERN | SYNDROME | PACKAGE POSITION | ERROR PATTERN |
|---|---|---|---|---|---|---|---|---|
| 11010011 | 10 | 0001 | 10111001 | 13 | 0001 | 11011001 | 16 | 0001 |
| 01000011 | 10 | 0010 | 10001001 | 13 | 0010 | 00011001 | 16 | 0010 |
| 10010000 | 10 | 0011 | 00110000 | 13 | 0011 | 11000000 | 16 | 0011 |
| 00111101 | 10 | 0100 | 10011011 | 13 | 0100 | 10011101 | 16 | 0100 |
| 11101110 | 10 | 0101 | 00100010 | 13 | 0101 | 01000100 | 16 | 0101 |
| 01111110 | 10 | 0110 | 00010010 | 13 | 0110 | 10000100 | 16 | 0110 |
| 10101101 | 10 | 0111 | 10101011 | 13 | 0111 | 01011101 | 16 | 0111 |
| 00110100 | 10 | 1000 | 10011000 | 13 | 1000 | 10010001 | 16 | 1000 |
| 11100111 | 10 | 1001 | 00100001 | 13 | 1001 | 01001000 | 16 | 1001 |
| 01110111 | 10 | 1010 | 00010001 | 13 | 1010 | 10001000 | 16 | 1010 |
| 10100100 | 10 | 1011 | 10101000 | 13 | 1011 | 01010001 | 16 | 1011 |
| 00001001 | 10 | 1100 | 00000011 | 13 | 1100 | 00001100 | 16 | 1100 |
| 11011010 | 10 | 1101 | 10111010 | 13 | 1101 | 11010101 | 16 | 1101 |
| 01001010 | 10 | 1110 | 10001010 | 13 | 1110 | 00010101 | 16 | 1110 |
| 10011001 | 10 | 1111 | 00110011 | 13 | 1111 | 11001100 | 16 | 1111 |
| 10110011 | 11 | 0001 | 01111001 | 14 | 0001 | 00000010 | 17 | 0001 |
| 00100011 | 11 | 0010 | 01001001 | 14 | 0010 | 00001000 | 17 | 0010 |
| 10010000 | 11 | 0011 | 00110000 | 14 | 0011 | 00001010 | 17 | 0011 |
| 00111011 | 11 | 0100 | 10010111 | 14 | 0100 | 00100000 | 17 | 0100 |
| 10001000 | 11 | 0101 | 11101110 | 14 | 0101 | 00100010 | 17 | 0101 |
| 00011000 | 11 | 0110 | 11011110 | 14 | 0110 | 00101000 | 17 | 0110 |
| 10101011 | 11 | 0111 | 10100111 | 14 | 0111 | 00101010 | 17 | 0111 |
| 00110010 | 11 | 1000 | 10010100 | 14 | 1000 | 10000000 | 17 | 1000 |
| 10000001 | 11 | 1001 | 11011110 | 14 | 1001 | 10000010 | 17 | 1001 |
| 00010001 | 11 | 1010 | 11101101 | 14 | 1010 | 10001000 | 17 | 1010 |
| 10100010 | 11 | 1011 | 10100100 | 14 | 1011 | 10001010 | 17 | 1011 |
| 00001001 | 11 | 1100 | 00000011 | 14 | 1100 | 10100000 | 17 | 1100 |
| 10111010 | 11 | 1101 | 01111010 | 14 | 1101 | 10100010 | 17 | 1101 |
| 00101010 | 11 | 1110 | 01001010 | 14 | 1110 | 10101000 | 17 | 1110 |
| 10011001 | 11 | 1111 | 00110011 | 14 | 1111 | 10101010 | 17 | 1111 |
| 01110011 | 12 | 0001 | 11101001 | 15 | 0001 | 00000001 | 18 | 0001 |
| 00010011 | 12 | 0010 | 00101001 | 15 | 0010 | 00000100 | 18 | 0010 |
| 01100000 | 12 | 0011 | 11000000 | 15 | 0011 | 00000101 | 18 | 0011 |
| 00110111 | 12 | 0100 | 10011110 | 15 | 0100 | 00010000 | 18 | 0100 |
| 01000100 | 12 | 0101 | 01110111 | 15 | 0101 | 00010001 | 18 | 0101 |
| 00100100 | 12 | 0110 | 10110111 | 15 | 0110 | 00010100 | 18 | 0110 |
| 01010111 | 12 | 0111 | 01011110 | 15 | 0111 | 00010101 | 18 | 0111 |
| 00110001 | 12 | 1000 | 10010010 | 15 | 1000 | 01000000 | 18 | 1000 |
| 01000010 | 12 | 1001 | 01111011 | 15 | 1001 | 01000001 | 18 | 1001 |
| 00100010 | 12 | 1010 | 10111011 | 15 | 1010 | 01000100 | 18 | 1010 |
| 01010001 | 12 | 1011 | 01010010 | 15 | 1011 | 01000101 | 18 | 1011 |
| 00000110 | 12 | 1100 | 00001100 | 15 | 1100 | 01010000 | 18 | 1100 |
| 01110101 | 12 | 1101 | 11100101 | 15 | 1101 | 01010001 | 18 | 1101 |
| 00010101 | 12 | 1110 | 00100101 | 15 | 1110 | 01010100 | 18 | 1110 |
| 01100110 | 12 | 1111 | 11001100 | 15 | 1111 | 01010101 | 18 | 1111 |

FIG. 4b

EXTENDED ERROR CORRECTION FOR SEC-DED CODES WITH PACKAGE ERROR DETECTION ABILITY

TECHNICAL FIELD

This invention relates generally to error correction. In particular, it relates to the correction of a number of hard errors beyond the unextended capability of the error correction code being used.

BACKGROUND OF THE INVENTION

Error correcting codes (ECC) have been routinely used for fault tolerance in computer memory subsystems. The most commonly used codes are the single error correcting (SEC)-double error detecting (DED) codes capable of correcting all single errors and detecting all double errors in a code word. These SEC-DED codes are most effective in protecting memory data when the memory array chips are configured in one-bit-per-chip with respect to the ECC words.

As the size of computer memories has increased while the individual memory cells have become further miniaturized, there has resulted an unacceptable occurrence of bit errors in data stored in a memory. No longer can an occasional error be allowed to cause a program to stop operating or require replacement of a memory chip. These bit errors are of two general types, soft errors and hard errors. A soft error is a seemingly random inversion of stored data. This inversion is caused by occasional bursts of electrical noise and, in some cases, by atomic particles, the so-called alpha particle upset. The soft errors problem has increased as the individual cell sizes have been reduced so that noise levels represent relatively low amounts of power.

A hard error, in contrast, represents a permanent electrical failure of the memory chip, often restricted to particular memory locations but also sometimes associated with peripheral circuitry of the memory chip so that the entire chip can be affected. Naturally, designers of memory chips have strived to reduce the occurrence of both hard and soft errors in their chips. However, both types of errors have not been completely eliminated and, indeed, it is not believed that they can be eliminated. Reliability beyond a certain point can be bought only at the expense of reduced performance or increased cost.

An alternative to the above solution for both hard and soft errors has been the implementation of ECC in large computer memories. The fundamentals of error detecting and correcting are described by R. W. Hamming in a technical article titled "Error detecting and error correcting codes" appearing in the Bell System Technical Journal, Volume 26, No. 2, 1950 at pages 147–160. In one of the most popular Hamming codes, an 8 bit data word is encoded to a 13-bit word according to a selected Hamming code. The described code is classified as SEC-DED. However, since a SEC-DED Hamming code can correct only a single random error (either soft or hard) occurring in any byte, more elaborate error correcting codes have been developed and implemented.

In particular, a better procedure has been developed for dealing with hard errors in multi-bit packages. These errors are referred to as package errors and the error correction codes designed specifically for package errors will be called package codes. The codes rely upon the fact that multiple hard errors do not randomly occur across the entire field of the data word. Instead, multiple hard errors are confined to a sub-field of the data word, affecting up to all the bits associated with the memory package and defined by the outputs of the package. In the context of a 4M×4 memory chip, consisting of a 16 megabit memory chip adapted to have 4 data ports simultaneously accessible, such a code cannot correct any four errors occurring in 32 bits. However, the code can correct four-bit errors that occur in any one of eight 4-bit sub-fields.

Nonetheless, even such codes are not completely satisfactory. If the code is a SPC-DPD (single package correct/double package detect) code, then the code can correct any errors that occur in only one package and can detect, but not correct, errors occurring in two packages. Thus if one package has suffered a hard failure, the occurrence of any additional errors, either soft or hard, in the remaining packages means that the error condition can be detected but the errors cannot be corrected. The existence of one hard failure is the effective limit of correction provided by a SPC-DPD code.

U.S. Pat. No. 4,661,955 ('955) discloses an extended error correcting device and method for SPC-DPD codes that is capable of correcting both a single soft error in one package and hard errors in another package. In the disclosed device and method, if the initial pass of the data through the error correction code indicates an uncorrected error, the data is complemented and restored in the memory and then reread. The reread data is recomplemented and again passed through the error correction code. The complementing, storing, retrieving, recomplementing, and ECC of the data is known as a "complement/recomplement" (comp/recomp) or an "invert and retry" procedure. If an uncorrected error persists after the comp/recomp, then a bit-by-bit comparison is performed between the originally read data and the retrieved complemented data to isolate the hard failure in the memory. The bits in the sub-field associated with the hard failure are sequentially changed and the changed data word is passed through the error correction code. A wrong combination is detected by the error correction code. The sub-field associated with the hard failure matches the originally stored data, in which case the error correction code can correct the remaining errors in the remaining sub-fields. However, the successive changes of the bits in the sub-field associated with the hard failure involve a long process of iterations. Moreover, this system has the disadvantage of involving a long process of bit by bit comparisons between the originally read data and the retrieved complemented ones, numerous compare circuits and latches, and a non-fixed length correcting sequence since the originally stored data in a sub-field associated with the hard fail can be any of the 16 different combinations.

U.S. Pat. No. 4,961,193 ('193), like the aforementioned '955, describes an extended error correcting device and method for SPC-DPD codes that is capable of correcting both a single soft error in one package and hard errors in another package. However, unlike the aforementioned '955, the device and method described in '193 does not use a bit-by-bit method. In the '193 device and method, if the initial pass of the data through the error correction code indicates an uncorrected error, the syndrome of the data is stored and a complement/recomplement procedure is performed. If an uncorrected error persists after the comp/recomp procedure, the syndrome of the data is added to the syndrome of the complemented data. This sum is checked to see if it is a double package error (DPE) and, therefore, uncorrectable. If this sum is not a DPE, it is then matched to values in a table. Given the sum, the table provides the package to correct and the bits in error within the package.

Using this data, the hard errors can be corrected. While this method avoids the use of a bit-by-bit process, it requires the use of a comp/recomp procedure and cannot be used with other processes known in the art, such as the read/write pattern test or the reference of data collected from past history.

SUMMARY OF THE INVENTION

In an embodiment of the present invention, a digital n-bit error correction-coded word includes a plurality of b-bit packages. The n-bit word is received from a data source having a faulty element, and an error correction code is performed on the n-bit word to correct a number of errors in the word. In addition to correcting the number of errors, the error correction code generates a syndrome for the word, and detects a number of errors in excess of the errors that it can correct. The position of the package in which the detected but uncorrected errors are located is then determined. Using the position of the package and the syndrome, an error pattern is determined. The errors in the n-bit word are then corrected using this pattern.

BRIEF DESCRIPTION OF THE DRAWINGS

Referring now to the drawings wherein like elements are numbered alike in the several FIGURES:

FIG. 3 is a parity check matrix of a (72, 64) code having 8 check bits and 64 data bits; and FIGS. 4 (A and B) is a package error correction table for determining a package error pattern from a syndrome and package position.

DETAILED DESCRIPTION OF THE INVENTION

Figure 1:
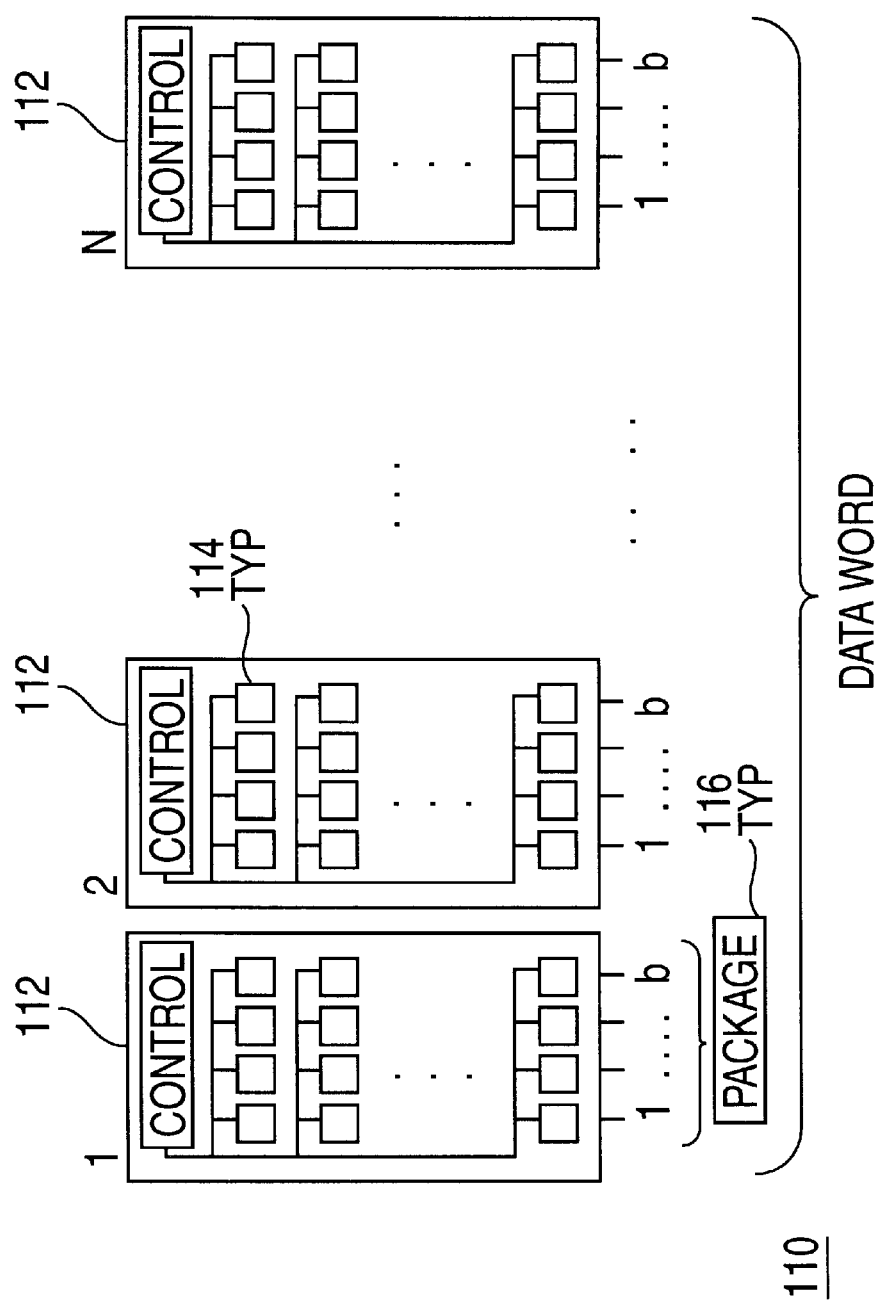
FIG. 1 is a pictorial representation of memory array partitions.

FIG. 1 is a pictorial representation of a memory array 110 partitioned into N elements 112 as may be found in a computer memory. Each of the N elements 112 include an array of memory locations 114 with b-bits being simultaneously accessible. For example, each element 112 may comprise a 4M×4 memory chip, consisting of a 16 megabit memory chip adapted to have 4 data ports 116 simultaneously accessible for the read/write of four bits. The b-bits of each element 112 are a package (sub-field). The N sub fields combine to create a data word of n-bits.

Figure 2:
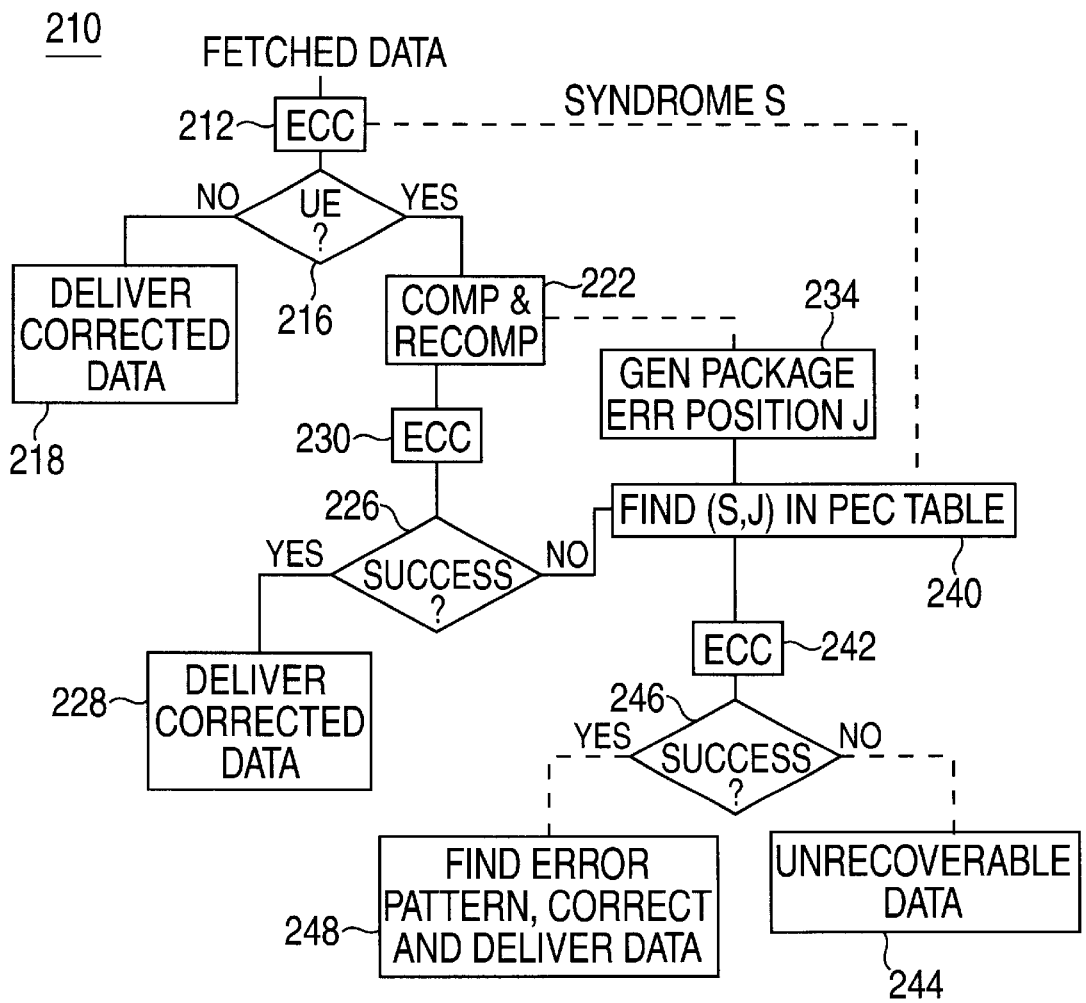
FIG. 2 is a flow diagram illustrating the extended error correction of the present invention.
Figure 3:
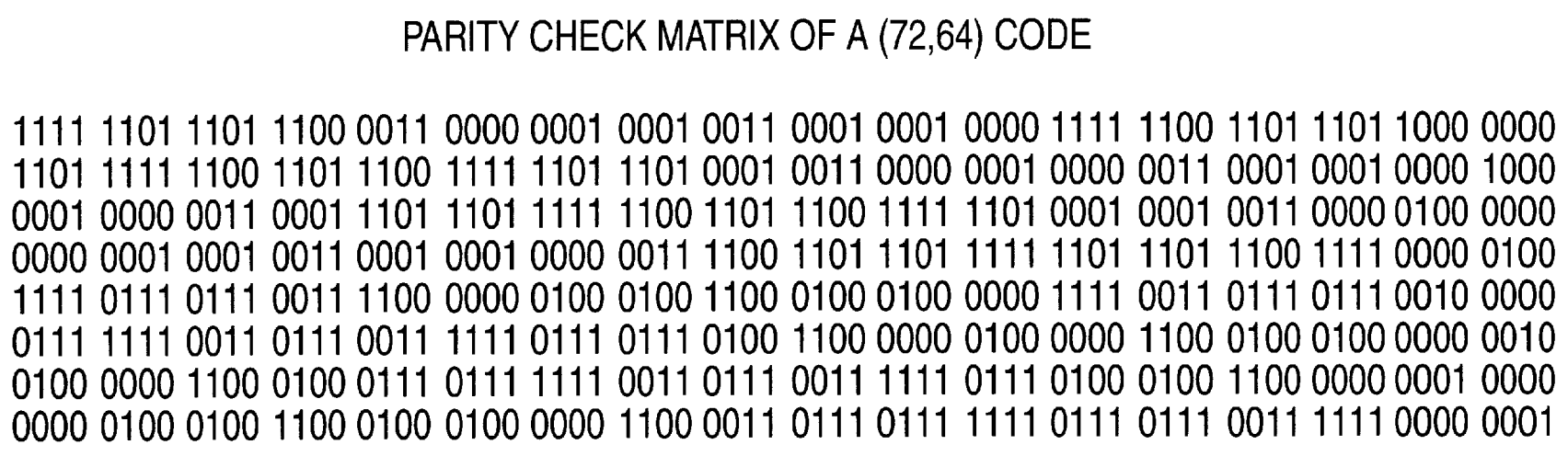

A package error correction procedure of the present invention, generally referred to as 210, is shown in FIG. 2. In procedure 210, a data word is fetched from an original memory location (data source). The fetched data are operated on by an error correcting code (ECC) in a block 212. The ECC is capable of correcting all single errors and detecting all double errors. It is also capable of detecting all single package errors. The operation of an ECC is known to those familiar with the art. The result of the operation of the ECC is inspected in a block 216 to see if there is no error or an uncorrected error (UE). If there is no error or the ECC can correct the error, the corrected data is delivered at 218. In the alternative, if an uncorrected error is found in block 216 it may be further operated on by subjecting the results to a comp/recomp procedure at a block 222. FIG. 3 shows a typical parity check matrix of a (72, 64) SEC-DED code capable of detecting all single 4-bit package errors having 8 check bits and 64 data bits as may be used for an ECC in block 212.

Referring again to FIG. 2, in the comp/recomp procedure of block 222 the fetched data are stored in an alternate memory location while a complement of the fetched data is stored back in the original memory location. The complemented data are retrieved from the original memory location, and recomplemented. The recomplemented data are then subjected to the ECC at a block 230. If the cause of the original error was due to a soft error, the double inversion and the ECC will likely produce the correct data. If there is no indication of an uncorrected error after the ECC processing, then the corrected value is delivered at a block 228. If, however, the ECC processing of the recomplemented data still produces an uncorrected error, then procedure 210 continues at a block 234. In block 234, the recomplemented data are compared to the originally fetched data stored in the alternate memory location. The recomplemented data should equal the originally fetched data because of the two intervening inversions. However, if the memory has suffered a hard failure such that one or more of the b-bit output values in the retrieved data are stuck either high or low, then the two data words will not be equal. If there is a hard error, the package error position, j, is identified at a block 234 from the comparison of the data.

While the described embodiment employs the comp/recomp method to detect which of the N memory partitions (elements) has failed due to a hard error, it will be understood by one skilled in the art that any similar procedure can be used. For example, this may include an actual read/write pattern test, or data collected from past history.

If the data are reported as UE in block 226, then S, the error syndrome, from the original data at block 212 and j, the package error position from block 234, are used in a block 240 as look up values in the package error correction (PEC) table shown in FIGS. 4A and 4B. As is shown in FIGS. 4A and 4B, the PEC table includes a plurality of unique package position and syndrome combinations. Each unique combination has a corresponding error pattern. For example in FIG. 4A, the combination of a syndrome 11100110 and a package position 7 results in an error pattern of 0001 indicating a failure of bit position 4.

Referring again to FIG. 2, if the unique package position is found in the PEC table at block 240, the errors in the original fetched data are corrected by flipping the data bits at the package position j according to the error pattern found. The corrected data are subjected to the ECC at a block 242. If there is no indication of an uncorrected error after the ECC processing in block 242, then the corrected value is delivered at block 248. If the S and j jointly are not an entry in the PEC table then the errors are reported as unrecoverable data at a block 244.

All single package errors are correctable using this scheme. The scheme will not improperly correct any double package errors in package j and another package, i. The errors will be detected as UE.

The disclosed scheme relies on a procedure to determine which of the N memory partitions has failed. This is either a comp/recomp procedure, an actual read/write pattern test, or data collected from past history. Determination of the failed memory partition is separated from determination of the failed bit pattern so one may use any conceivable approach to determine which of the N memory partitions has failed.

The present invention can be embodied in the form of computer-implemented processes and apparatuses for practicing those processes. The present invention can also be embodied in the form of computer program code containing instructions embodied in tangible media, such as floppy diskettes, CD-ROMs, hard drives, or any other computer-readable storage medium, wherein, when the computer program code is loaded into and executed by a computer, the computer becomes an apparatus for practicing the invention. The present invention can also be embodied in the form of computer program code, for example, whether stored in a storage medium, loaded into and/or executed by a computer, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits.

While a preferred embodiment has been shown and described, various modifications and substitutions may be made thereto without departing from the spirit and scope of the invention. Accordingly, it is to be understood that the present invention has been described by way of illustration and not limitation.

What is claimed is:

1. A method of correcting multiple errors in a digital n-bit error correction-coded word, each word comprising a plurality of b-bit packages, said method comprising:

receiving from a data source an n-bit word, n being an integer;

executing an error correction code on said received n-bit word to correct up to a first predetermined number of errors in a predetermined distribution in said data word, said executing an error correction code including generating a syndrome for said n-bit data word, and detecting an error in excess of said predetermined number of errors in said predetermined distribution;

determining a complemented word by complementing said n-bit word in response to detecting an error in excess of said predetermined number of errors;

storing said complemented word in said data source;

retrieving said complemented word from said data source;

determining a re-complemented word by complementing said complemented word retrieved from said data source;

executing an error correction code on said re-complemented word to determined said error in excess of said predetermined number of errors is a hard error caused by a faulty element in said data source;

determining a position of a b-bit package within said n-bit word, said b-bit package including said hard error, b being an integer;

determining an error pattern for said b-bit package using said position and said syndrome; and correcting said n-bit word using said error pattern.

2. The method of claim 1, including:

providing a package error correction table having a plurality of unique package position and syndrome combinations, each of said plurality of unique package position and syndrome combinations corresponding to an error pattern; and said determining an error pattern for said b-bit package includes matching said position and said syndrome to one of said plurality of unique package position and syndrome combinations to determine said error pattern for said b-bit package.

3. The method of claim 1, wherein said determining said position of said b-bit package within said n-bit word includes:

comparing said n-bit word and said re-complemented word to determine said position.

4. The method of claim 1, wherein said determining said position of said b-bit package within said n-bit word includes:

performing a read/write pattern test.

5. The method of claim 1, wherein said determining said position of said b-bit package within said n-bit word includes:

determining said position using data collected from past history.

6. A storage medium encoded with machine-readable computer program code for correcting multiple errors in a digital n-bit error correction-coded word, the storage medium including instructions for causing a computer to implement a method comprising:

receiving from a data source an n-bit word, n being an integer;

executing an error correction code on said received n-bit word to correct up to a first predetermined number of errors in a predetermined distribution in said data word, said executing an error correction code including generating a syndrome for said n-bit data word, and detecting an error in excess of said predetermined number of errors in said predetermined distribution;

determining a complemented word by complementing said n-bit word in response to detecting an error in excess of said predetermined number of errors;

storing said complemented word in said data source;

retrieving said complemented word from said data source;

determining a re-complemented word by complementing said complemented word retrieved from said data source;

executing an error correction code on said re-complemented word to determined said error in excess of said predetermined number of errors is a hard error caused by a faulty element in said data source;

determining a position of a b-bit package within said n-bit word, said b-bit package including said hard error, b being an integer;

determining an error pattern for said b-bit package using said position and said syndrome; and correcting said n-bit word using said error pattern.

7. The storage medium of claim 6 further comprising instructions for causing a computer to implement:

providing a package error correction table having a plurality of unique package position and syndrome combinations, each of said plurality of unique package position and syndrome combinations corresponding to an error pattern; and said determining an error pattern for said b-bit package includes matching said position and said syndrome to one of said plurality of unique package position and syndrome combinations to determine said error pattern for said b-bit package.

8. The storage medium of claim 6, wherein said determining said position of said n-bit word includes:

comparing said n-bit word and said re-complemented word to determining said position.

9. The storage medium of claim 6, wherein said determining said position of said b-bit package within said n-bit word includes:

performing a read/write pattern test.

10. The storage medium of claim 6, wherein said determining said position of said b-bit package within said n-bit word includes:

determining said position using data collected from past history.

* * * * *